US006965626B2

(12) United States Patent
Tatum et al.

(10) Patent No.: US 6,965,626 B2
(45) Date of Patent: Nov. 15, 2005

(54) SINGLE MODE VCSEL

(75) Inventors: James A. Tatum, Plano, TX (US);
James K Guenter, Garland, TX (US);
Ralph H. Johnson, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/232,382

(22) Filed: Sep. 3, 2002

(65) Prior Publication Data
US 2004/0042518 A1 Mar. 4, 2004

(51) Int. Cl.[7] .............................. H01S 3/097; H01S 5/00
(52) U.S. Cl. .............................. 372/87; 372/43; 372/44; 372/45; 372/46
(58) Field of Search ................................ 372/87, 43–46

(56) References Cited

U.S. PATENT DOCUMENTS

| | | | |
|---|---|---|---|
| 4,317,085 A | 2/1982 | Burnham et al. | 372/50 |
| 4,466,694 A | 8/1984 | MacDonald | 350/96.19 |
| 4,660,207 A | 4/1987 | Svilans | 372/45 |
| 4,675,058 A | 6/1987 | Plaster | 148/171 |
| 4,784,722 A | 11/1988 | Liau et al. | 156/649 |
| 4,885,592 A | 12/1989 | Kofol et al. | 343/754 |
| 4,901,327 A | 2/1990 | Bradley | 372/45 |
| 4,943,970 A | 7/1990 | Bradley | 372/45 |
| 4,956,844 A | 9/1990 | Goodhue et al. | 372/44 |
| 5,031,187 A | 7/1991 | Orenstein et al. | 372/50 |
| 5,052,016 A | 9/1991 | Mahbobzadeh | 372/96 |
| 5,056,098 A | 10/1991 | Anthony et al. | 372/45 |
| 5,062,115 A | 10/1991 | Thornton | 372/50 |
| 5,068,869 A | 11/1991 | Wang et al. | 372/45 |
| 5,079,774 A | 1/1992 | Mendez et al. | 372/27 |
| 5,115,442 A | 5/1992 | Lee et al. | 372/45 |
| 5,117,469 A | 5/1992 | Cheung et al. | 385/11 |
| 5,140,605 A | 8/1992 | Paoli et al. | 372/50 |
| 5,157,537 A | 10/1992 | Rosenblatt et al. | 359/245 |
| 5,158,908 A | 10/1992 | Blonder et al. | 437/129 |
| 5,212,706 A | 5/1993 | Jain | 372/50 |
| 5,216,263 A | 6/1993 | Paoli | 257/88 |
| 5,216,680 A | 6/1993 | Magnusson et al. | 372/20 |
| 5,237,581 A | 8/1993 | Asada et al. | 372/45 |

(Continued)

FOREIGN PATENT DOCUMENTS

| | | |
|---|---|---|
| DE | 4240706 | 6/1994 |
| EP | 0288184 | 10/1988 |
| EP | 0776076 | 5/1997 |

(Continued)

OTHER PUBLICATIONS

Banwell et al., "VCSE Laser Transmitters for Parallel Data Links", *IEEE Journal of Quantum Electronics*, vol. 29, No. 2, Feb. 1993, pp. 635–644.

(Continued)

*Primary Examiner*—Paul Ip
*Assistant Examiner*—Leith A Al-Nazer
(74) *Attorney, Agent, or Firm*—Workman Nydegger

(57) ABSTRACT

A VCSEL having a metallic heat spreading layer adjacent a semiconductor buffer layer containing an insulating structure. The heat spreading layer includes an opening that enables light emitted by an active region to reflect from a distributed Bragg reflector (DBR) top mirror located above the heat spreading layer. A substrate is below the active region. A lower contact provides electrical current to that substrate. The lower contact includes an opening that enables light emitted from the active region to reflect from a distributed Bragg reflector (DBR) lower mirror. Beneficially, the substrate includes a slot that enables light to pass through an opening in the lower contact. That slot acts as an alignment structure that enables optical alignment of an external feature to the VCSEL.

24 Claims, 6 Drawing Sheets

U.S. PATENT DOCUMENTS

| | | | |
|---|---|---|---|
| 5,245,622 A | 9/1993 | Jewell et al. | 372/45 |
| 5,258,990 A | 11/1993 | Olbright et al. | 372/46 |
| 5,262,360 A | 11/1993 | Holonyak, Jr. et al. | 437/237 |
| 5,285,466 A | 2/1994 | Tabatabaie | 372/50 |
| 5,293,392 A | 3/1994 | Shieh et al. | 372/45 |
| 5,317,170 A | 5/1994 | Paoli | 257/88 |
| 5,317,587 A | 5/1994 | Ackley et al. | 372/45 |
| 5,325,386 A | 6/1994 | Jewell et al. | 372/50 |
| 5,331,654 A | 7/1994 | Jewell et al. | 372/45 |
| 5,337,074 A | 8/1994 | Thornton | 346/107 |
| 5,337,183 A | 8/1994 | Rosenblatt et al. | 359/248 |
| 5,349,599 A | 9/1994 | Larkins | 372/50 |
| 5,351,256 A | 9/1994 | Schneider et al. | 372/45 |
| 5,359,447 A | 10/1994 | Hahn et al. | 359/154 |
| 5,359,618 A | 10/1994 | Lebby et al. | 372/45 |
| 5,363,397 A | 11/1994 | Collins et al. | 372/92 |
| 5,373,520 A | 12/1994 | Shoji et al. | 372/45 |
| 5,373,522 A | 12/1994 | Holonyak, Jr. et al. | 372/45 |
| 5,376,580 A | 12/1994 | Kish et al. | 437/127 |
| 5,386,426 A | 1/1995 | Stephens | 372/20 |
| 5,390,209 A | 2/1995 | Vakhshoori | 372/45 |
| 5,396,508 A | 3/1995 | Bour et al. | 372/27 |
| 5,404,373 A | 4/1995 | Cheng | 372/50 |
| 5,412,678 A | 5/1995 | Treat et al. | 372/45 |
| 5,412,680 A | 5/1995 | Swirhum et al. | 372/45 |
| 5,416,044 A | 5/1995 | Chino et al. | 437/129 |
| 5,422,901 A | 6/1995 | Lebby et al. | 372/36 |
| 5,428,634 A | 6/1995 | Bryan et al. | 372/45 |
| 5,438,584 A | 8/1995 | Paoli et al. | 372/45 |
| 5,446,754 A | 8/1995 | Jewell et al. | 372/50 |
| 5,465,263 A | 11/1995 | Bour et al. | 372/23 |
| 5,475,701 A | 12/1995 | Hibbs-Brenner | 372/50 |
| 5,493,577 A | 2/1996 | Choquette et al. | 372/46 |
| 5,497,390 A | 3/1996 | Tanaka et al. | 372/50 |
| 5,513,202 A | 4/1996 | Kobayashi et al. | 372/96 |
| 5,530,715 A | 6/1996 | Shieh et al. | 372/96 |
| 5,555,255 A | 9/1996 | Kock et al. | 372/96 |
| 5,557,626 A | 9/1996 | Grodinski et al. | 372/45 |
| 5,561,683 A | 10/1996 | Kwon | 372/96 |
| 5,567,980 A | 10/1996 | Holonyak, Jr. et al. | 257/631 |
| 5,568,498 A | 10/1996 | Nilsson | 372/43 |
| 5,568,499 A | 10/1996 | Lear | 372/45 |
| 5,574,738 A * | 11/1996 | Morgan | 372/28 |
| 5,581,571 A | 12/1996 | Holonyak, Jr. et al. | 372/46 |
| 5,586,131 A | 12/1996 | Ono et al. | 372/19 |
| 5,590,145 A | 12/1996 | Nitta | 372/50 |
| 5,598,300 A | 1/1997 | Magnusson et al. | 359/566 |
| 5,606,572 A | 2/1997 | Swirhun et al. | 372/96 |
| 5,727,014 A | 3/1997 | Wang et al. | 372/96 |
| 5,625,637 A | 4/1997 | Mori et al. | 372/96 |
| 5,625,729 A | 4/1997 | Brown | 385/31 |
| 5,642,376 A | 6/1997 | Olbright et al. | 372/99 |
| 5,645,462 A | 7/1997 | Banno et al. | 445/51 |
| 5,646,978 A | 7/1997 | Kem et al. | 455/436 |
| 5,648,978 A | 7/1997 | Sakata | 372/50 |
| 5,679,963 A | 10/1997 | Klem et al. | 257/46 |
| 5,692,083 A | 11/1997 | Bennett | 385/14 |
| 5,696,023 A | 12/1997 | Holonyak, Jr. et al. | 437/133 |
| 5,699,373 A | 12/1997 | Uchida et al. | 372/27 |
| 5,712,188 A | 1/1998 | Chu et al. | 437/129 |
| 5,726,805 A | 3/1998 | Kaushik et al. | 359/589 |
| 5,727,013 A | 3/1998 | Botez et al. | 372/96 |
| 5,745,515 A * | 4/1998 | Marta et al. | 372/45 |
| 5,774,487 A | 6/1998 | Morgan | 372/45 |
| 5,778,018 A | 7/1998 | Yoshikawa et al. | 372/45 |
| 5,781,575 A | 7/1998 | Nilsson | 372/50 |
| 5,784,399 A | 7/1998 | Sun | 372/50 |
| 5,790,733 A | 8/1998 | Smith et al. | 385/88 |
| 5,805,624 A | 9/1998 | Yang et al. | 372/45 |
| 5,818,066 A | 10/1998 | Duboz | 257/21 |
| 5,818,862 A | 10/1998 | Salet | 372/46 |
| 5,828,684 A | 10/1998 | Van de Walle | 372/45 |
| 5,838,705 A | 11/1998 | Shieh et al. | 372/45 |
| 5,838,715 A | 11/1998 | Corzine et al. | 372/96 |
| 5,892,784 A | 4/1999 | Tan et al. | 372/43 |
| 5,892,787 A | 4/1999 | Tan et al. | 372/96 |
| 5,896,408 A | 4/1999 | Corzine et al. | 372/46 |
| 5,901,166 A | 5/1999 | Nitta et al. | 372/50 |
| 5,903,588 A | 5/1999 | Guenter et al. | 372/46 |
| 5,903,589 A | 5/1999 | Jewell | 372/46 |
| 5,903,590 A | 5/1999 | Hadley et al. | 372/96 |
| 5,908,408 A | 6/1999 | McGary et al. | 604/110 |
| 5,936,266 A | 8/1999 | Holonyak, Jr. et al. | 257/106 |
| 5,940,422 A | 8/1999 | Johnson | 372/45 |
| 5,953,362 A | 9/1999 | Pamulapati et al. | 372/96 |
| 5,978,401 A | 11/1999 | Morgan | 372/50 |
| 5,978,408 A | 11/1999 | Thornton | 372/96 |
| 5,991,326 A | 11/1999 | Yuen et al. | 372/96 |
| 5,995,531 A | 11/1999 | Gaw et al. | 372/96 |
| 6,002,705 A | 12/1999 | Thornton | 372/96 |
| 6,008,675 A | 12/1999 | Handa | 372/96 |
| 6,014,395 A | 1/2000 | Jewell | 372/45 |
| 6,043,104 A | 3/2000 | Uchida et al. | 438/32 |
| 6,046,065 A | 4/2000 | Goldstein et al. | 438/46 |
| 6,052,398 A | 4/2000 | Brillouet et al. | 372/46 |
| 6,055,262 A | 4/2000 | Cox et al. | 372/96 |
| 6,060,743 A | 5/2000 | Sugiyama et al. | 257/321 |
| 6,064,683 A | 5/2000 | Johnson | 372/46 |
| 6,078,601 A | 6/2000 | Smith | 372/38 |
| 6,086,263 A | 7/2000 | Selli et al. | 385/88 |
| 6,133,590 A | 10/2000 | Ashley et al. | 257/106 |
| 6,144,682 A | 11/2000 | Sun | 372/45 |
| 6,154,480 A | 11/2000 | Magnusson et al. | 372/96 |
| 6,159,760 A | 12/2000 | Goossen et al. | 438/34 |
| 6,185,241 B1 | 2/2001 | Sun | 372/96 |
| 6,191,890 B1 | 2/2001 | Baets et al. | 359/572 |
| 6,201,825 B1 * | 3/2001 | Sakurai et al. | 372/96 |
| 6,208,681 B1 | 3/2001 | Thorton | 372/96 |
| 6,212,312 B1 | 4/2001 | Grann et al. | 385/24 |
| 6,238,944 B1 | 5/2001 | Floyd | 438/45 |
| 6,269,109 B1 | 7/2001 | Jewell | 372/43 |
| 6,297,068 B1 | 10/2001 | Thornton | 438/46 |
| 6,302,596 B1 | 10/2001 | Cohen et al. | 385/93 |
| 6,339,496 B1 | 1/2002 | Koley et al. | 359/344 |
| 6,369,403 B1 | 4/2002 | Holonyak, Jr. | 257/13 |
| 6,372,533 B2 | 4/2002 | Jayaraman et al. | 438/22 |
| 6,392,257 B1 | 5/2002 | Ramdani et al. | 257/190 |
| 6,410,941 B1 | 6/2002 | Taylor et al. | 257/84 |
| 6,411,638 B1 | 6/2002 | Johnson et al. | 372/46 |
| 6,427,066 B1 | 7/2002 | Grube | 455/73 |
| 6,455,879 B1 | 9/2002 | Ashley et al. | 257/106 |
| 6,459,709 B1 | 10/2002 | Lo et al. | 372/20 |
| 6,459,713 B2 | 10/2002 | Jewell | 372/46 |
| 6,462,360 B1 | 10/2002 | Higgins, Jr. et al. | 257/189 |
| 6,472,694 B1 | 10/2002 | Wilson et al. | 257/189 |
| 6,477,285 B1 | 11/2002 | Shanley | 385/14 |
| 6,487,230 B1 | 11/2002 | Boucart et al. | 372/96 |
| 6,487,231 B1 | 11/2002 | Boucart et al. | 372/96 |
| 6,490,311 B1 | 12/2002 | Boucart et al. | 372/96 |
| 6,493,371 B1 | 12/2002 | Boucart et al. | 372/96 |
| 6,493,372 B1 | 12/2002 | Boucart et al. | 372/96 |
| 6,493,373 B1 | 12/2002 | Boucart et al. | 372/96 |
| 6,496,621 B1 | 12/2002 | Kathman et al. | 385/31 |
| 6,498,358 B1 | 12/2002 | Lach et al. | 257/183 |
| 6,501,973 B1 | 12/2002 | Foley et al. | 600/310 |
| 6,515,308 B1 | 2/2003 | Kneissl et al. | 257/86 |
| 6,535,541 B1 | 3/2003 | Boucart et al. | 372/96 |
| 6,536,959 B2 | 3/2003 | Kuhn et al. | 385/93 |
| 6,542,531 B2 | 4/2003 | Sirbu et al. | 372/46 |
| 6,567,435 B1 | 5/2003 | Scott et al. | 372/29.021 |
| 2001/0004414 A1 | 6/2001 | Kuhn et al. | 385/93 |

| | | | |
|---|---|---|---|
| 2001/0011730 A1 | 8/2001 | Saeki | 257/79 |
| 2002/0071464 A1 | 6/2002 | Coldren et al. | 372/45 |
| 2002/0094001 A1 | 7/2002 | Otsubo | 372/45 |
| 2002/0154675 A1 | 10/2002 | Deng et al. | 372/96 |
| 2003/0038291 A1 | 2/2003 | Cao | 257/81 |
| 2003/0039119 A1 | 2/2003 | Cao | 362/227 |
| 2003/0039120 A1 | 2/2003 | Cao | 362/227 |
| 2003/0039122 A1 | 2/2003 | Cao | 362/294 |
| 2003/0039284 A1 | 2/2003 | Zheng | 372/45 |
| 2003/0039294 A1 | 2/2003 | Ueki et al. | 372/96 |
| 2003/0040133 A1 | 2/2003 | Horng et al. | 438/22 |
| 2003/0040200 A1 | 2/2003 | Cao | 438/800 |
| 2003/0072526 A1 | 4/2003 | Kathman et al. | 385/31 |

FOREIGN PATENT DOCUMENTS

| | | |
|---|---|---|
| EP | 0822630 | 2/1998 |
| EP | 1 026 798 A2 | 8/2000 |
| JP | 60123084 | 1/1985 |
| JP | 02054981 | 2/1990 |
| JP | 5299779 | 11/1993 |
| WO | WO 98/07218 | 2/1998 |
| WO | WO 98/57402 | 12/1998 |
| WO | WO 02/17445 | 2/2002 |
| WO | WO 03/023457 | 3/2003 |

OTHER PUBLICATIONS

Bowers et al., "Fused Vertical Cavity Lasers With Oxide Aperture", Final report for MICRO project 96–042, Industrial Sponsor: Hewlett Packard, 4 pages, 1996-97.

Catchmark et al., "High Temperature CW Operation of Vertical Cavity Top Surface–Emitting Lasers", CLEO 1993, p. 138.

Chemla et al., "Nonlinear Optical Properties of Semiconductor Quantum Wells", *Optical Nonlinearities and Instabilities in Semiconductors*, Academic Press, Inc., Copyright 1988, pp. 83–120.

Choe, et al., "Lateral oxidation of AlAs layers at elevated water vapour pressure using a closed–chamber system," Letter to the Editor, Semiconductor Science Technology, 15, pp. L35–L38, Aug. 2000.

Choa et al., "High–Speed Modulation of Vertical–Cavity Surface–Emitting Lasers", *IEEE Photonics Technology Letter*, vol. 3, No. 8, Aug. 1991, pp. 697–699.

Choquette et al., "High Single Mode Operation from Hybrid Ion Implanted/Selectively Oxidized VCSELs", 200 IEEE 17th International Semiconductor Laser Conference, Monterrey, CA pp. 59–60.

Choquette et al., "Lithograpically–Defined Gain Apertures Within Selectively Oxidized VCSELs", paper CtuL6, Conference on Lasers and Electro–Optics, San Francisco, California (2000).

Choquette, et al., "VCSELs in information systems: 10Gbps$^{-1}$ oxide VCSELs for data communication", Optics In Information Systems, vol. 12, No. 1, p. 5, SPIE International Technical Group Newsletter, Apr. 2001.

Chua, et al., "Low–Threshold 1.57– $\mu$m VC–SEL's Using Strain–Compensated Quantum Wells and Oxide/Metal Backmirror," IEEE Photonics Technology Letters, vol. 7, No. 5, pp. 444–446, May 1995.

Chua, et al., "Planar Laterally Oxidized Vertical–Cavity Lasers for Low–Threshold High–Density Top–Surface–Emitting Arrays," IEEE Photonics Technology Letters, vol. 9, No. 8, pp. 1060–1062, Aug. 1997.

Cox, J. A., et al., "Guided Mode Grating Resonant Filters for VCSEL Applications", *Proceedings of the SPIE*, The International Society for Optical Engineering, Diffractive and Holographic Device Technologies and Applications V, San Jose, California, Jan. 28–29, 1998, vol. 3291, pp. 70–71.

Farrier, Robert G., "Parametric control for wafer fabrication: New CIM techniques for data analysis," Solid State Technology, pp. 99–105, Sep. 1997.

Fushimi, et al., "Degradation Mechanism in Carbon–doped GaAs Minority–carrier Injection Devices," 34th Annual IRPS Proceedings, Dallas, TX., Apr. 29–May 2, 1996, 8 pages.

G. G. Ortiz, et al., "Monolithic Integration of In0.2 GA0.8As Vertical Cavity Surface–Emitting Lasers with Resonance–Enhanced Quantum Well Photodetectors", *Electronics Letters*, vol. 32, No. 13, Jun. 20, 1996, pp. 1205–1207.

G. Shtengel et al., "High–Speed Vertical–Cavity Surface–Emitting Lasers", *Photon. Tech. Lett.*, vol. 5, No. 12, pp. 1359–1361 (Dec. 1993).

Geib, et al., "Comparison of Fabrication Approaches for Selectively Oxidized VCSEL Arrays," Proceedings of SPIE, vol. 3946, pp. 36–40, 2000.

Graf, Rudolph, *Modern Dictionary of Electronics*, 6th ed., Indiana: Howard W. Sams & Company, 1984, p. 694.

Guenter et al., "Reliability of Proton–Implanted VCSELs for Data Communications", Invited paper, *SPIE*, vol. 2683, OE LASE 96; Photonics West: Fabrication, Testing and Reliability of Semiconductor Lasers, (SPIE, Bellingham, WA 1996).

Guenter, et al., "Commercialization of Honeywell's VCSEL technology: further developments," Proceedings of the SPIE, vol. 4286, GSPIE 2000, 14 pages.

Hadley et al., "High–Power Single Mode Operation from Hybrid Ion Implanted/Selectively Oxidized VCSELs", 13th Annual Meeting IEEE Lasers and Electro–Optics Society 2000 Annual Meeting (LEOS 2000), Rio Grande, Puerto Rico, pp. 804–805.

Hawthorne, et al., "Reliability Study of 850 nm VCSELs for Data Communications," IEEE, pp. 1–11, May 1996.

Herrick, et al., "Highly reliable oxide VCSELs manufactured at HP/Agilent Technologies," Invited Paper, Proceedings of SPIE vol. 3946, pp. 14–19, 2000.

Hibbs–Brenner et al., "Performance, Uniformity and Yield of 850nm VCSELs Deposited by MOVPE", *IEEE Phot. Tech. Lett.*, vol. 8, No. 1, pp. 7–9, Jan. 1996.

Hideaki Saito, et al., "Controlling polarization of quantum–dot surface–emitting lasers by using structurally anisotropic self–assembled quantum dots," American Institute of Physics, Appl, Phys. Lett. 71 (5), pp. 590–592, Aug. 4, 1997.

Hornak et al., "Low–Temperature (10K–300K) Characterization of MOVPE–Grown Vertical–Cavity Surface–Emitting Lasers", *Photon. Tech. Lett.*, vol. 7, No. 10, pp. 1110–1112, Oct. 1995.

Huffaker et al., "Lasing Characteristics of Low Threshold Microcavity Layers Using Half–Wave Spacer Layers and Lateral Index Confinement", *Appl. Phys. Lett.*, vol. 66, No. 14, pp.1723–1725, Apr. 3, 1995.

Jewell et al., "Surface Emitting Microlasers for Photonic Switching & Intership Connections", *Optical Engineering*, vol. 29, No. 3, pp. 210–214, Mar. 1990.

Jiang et al., "High–Frequency Polarization Self–Modulation in Vertical–Cavity Surface–Emitting Lasers", *Appl. Phys. Letters.*, vol. 63, No. 26, Dec. 27, 1993, pp. 2545–2547.

K.L. Lear et al., "Selectively Oxidized Vertical Cavity Surface–Emitting Lasers with 50% Power Conversion Efficiency", *Elec. Lett.*, vol. 31, No. 3 pp. 208–209, Feb. 2, 1995.

Kash, et al., "Recombination in GaAs at the AlAs oxide–GaAs interface," Applied Physics Letters, vol. 67, No. 14, pp. 2022–2024, Oct. 2, 1995.

Kishino et al., "Resonant Cavity–Enhanced (RCE) Photodetectors", *IEEE Journal of Quantum Electronics*, vol. 27, No. 8, pp. 2025–2034.

Koley B., et al., "Dependence of lateral oxidation rate on thickness of AlAs layer of interest as a current aperture in vertical–cavity surface–emitting laser structures", Journal of Applied Physics, vol. 84, No. 1, pp. 600–605, Jul. 1, 1998.

Kuchibhotla et al., "Low–Voltage High Gain Resonant Cavity Avalanche Photodiode", *IEEE Photonics Technology Letters*, vol. 3, No. 4, pp. 354–356.

Lai et al., "Design of a Tunable GaAs/AlGaAs Multiple–Quantum–Well Resonant Cavity Photodetector", *IEEE Journal of Quantum Electronics*, vol. 30, No. 1, pp. 108–114.

Lee et al., "Top–Surface Emitting GaAs Four–Quantum–Well Lasers Emitting at 0–85 um", *Electronics Letters*, vol. 24, No. 11, May 24, 1990, pp. 710–711.

Lehman et al., "High Frequency Modulation Characteristics of Hybrid Dielectric/AlGaAs Mirror Singlemode VCSELs", *Electronic Letters*, vol. 31, No. 15, Jul. 20, 1995, pp. 1251–1252.

Maeda, et al., "Enhanced Glide of Dislocations in GaAs Single Crystals by Electron Beam Irradiation," Japanese Journal of Applied Physics, vol. 20, No. 3, pp. L165–L168, Mar. 1981.

Magnusson, "Integration of Guided–Mode Resonance Filters and VCSELs", Electo–Optics Research Center, Department of Electrical Engineering, University of Texas at Arlington, May 6, 1997.

Martinsson et al., "Transverse Mode Selection in Large–Area Oxide–Confined Vertical–Cavity Surface–Emitting Lasers Using a Shallow Surface Relief", *IEEE Photon. Technol. Lett.*, 11(12), 1536–1538 (1999).

Miller et al., "Optical Bistability Due to Increasing Absorption", *Optics Letters*, vol. 9, No. 5, May 1984, pp. 162–164.

Min Soo Park and Byung Tae Ahn, "Polarization control of vertical–cavity surface–emitting lasers by electro–optic birefringence," Applied Physics Letter, vol. 76, No. 7, pp. 813–815, Feb. 14, 2000.

Morgan et al., "200 C, 96–nm Wavelength Range, Continuous–Wave Lasing from Unbonded GaAs MOVPE–Grown Vertical Cavity Surface–Emitting Lasers", *IEEE Photonics Technology Letters*, vol. 7, No. 5, May 1995, pp. 441–443.

Morgan et al., "High–Power Coherently Coupled 8×8 Vertical Cavity Surface Emitting Laser Array", *Appl. Phys Letters*, vol. 61, No. 10, Sep. 7, 1992, pp. 1160–1162.

Morgan et al., "Hybrid Dielectric/AlGaAs Mirror Spatially Filtered Vertical Cavity Top–Surface Emitting Laser", *Appl. Phys. Letters*, vol. 66, No. 10, Mar. 6, 1995, pp. 1157–1159.

Morgan et al., "Novel Hibrid–DBR Single–Mode Controlled GaAs Top–Emitting VCSEL with Record Low Voltage", 2 pages, dated prior to Dec. 29, 2000.

Morgan et al., "One Watt Vertical Cavity Surface Emitting Laser", *Electron. Lett.*, vol. 29, No. 2, pp. 206–207, Jan. 21, 1993.

Morgan et al., "Producible GaAs–based MOVPE–Grown Vertical Cavity Top–Surface Emitting Lasers with Record Performance", *Elec. Lett.*, vol. 31, No. 6, pp. 462–464, Mar. 16, 1995.

Morgan et al., "Progress and Properties of High–Power Coherent Vertical Cavity Surface Emitting Laser Arrays", *SPIE*, Vo 1850, Jan. 1993, pp. 100–108.

Morgan et al., "Progress in Planarized Vertical Cavity Surface Emitting Laser Devices and Arrays", *SPIE*, vol. 1562, Jul. 1991, pp. 149–159.

Morgan et al., "Spatial–Filtered Vertical–Cavity Top Surface–Emitting Lasers", CLEO, 1993, pp. 138–139.

Morgan et al., "Submilliamp, Low–Resistance, Continuous–Wave, Single–Mode GaAs Planar Vertical–Cavity Surface Emitting Lasers", Honeywell Technology Center, Jun. 6, 1995.

Morgan et al., "Transverse Mode Control of Vertical–Cavity Top–Surface Emitting Lasers", *IEEE Photonics Technology Letters*, vol. 4, No. 4, Apr. 1993, pp. 374–377.

Morgan et al., "Vertical–cavity surface–emitting laser arrays", Invited Paper, *SPIE*, vol. 2398, Feb. 6, 1995, pp. 65–93.

Morgan et al., Vertical–cavity surface emitting lasers come of age, Invited paper, *SPIE*, vol. 2683, 0–8194–2057, Mar. 1996, pp. 18–29.

Morgan, "High–Performance, Producible Vertical Cavity Lasers for Optical Interconnects", *High Speed Electronics and Systems*, vol. 5, No. 4, Dec. 1994, pp. 65–95.

Naone R.L., et al., "Tapered–apertures for high–efficiency miniature VCSELs", LEOS newsletter, vol. 13, No. 4, pp. 1–5, Aug. 1999.

Nugent et al., "Self–Pulsations in Vertical–Cavity Surface–Emitting Lasers", *Electronic Letters*, vol. 31, No. 1, Jan. 5, 1995, pp. 43–44.

Oh, T. H. et al., "Single–Mode Operation in Antiguided Vertical–Cavity Surface–Emitting Laser Using a Low–Temperature Grown AlGaAs Dielectric Aperture", *IEEE Photon. Technol. Lett*, 10(8), 1064–1066 (1998).

Osinski, et al., "Temperature and Thickness Dependence of Steam Oxidation of AlAs in Cylindrical Mesa Structure," IEEE Photonics Technology Letters, vol. 13, No. 7, pp. 687–689, Jul. 2001.

Peck, D. Stewart, Comprehensive Model for Humidity Testing Correlation, IEEE/IRPS, pp. 44–50, 1986.

Ries, et al., "Visible–spectrum ($\lambda$=650nm) photopumped (pulsed, 300 K) laser operation of a vertical–cavity AlAs – AlGaAs/InGaP quantum well heterostructure utilizing native oxide mirrors," Applied Physics Letters, vol. 67, No. 8, pp. 1107–1109, Aug. 21, 1995.

S.S. Wang and R. Magnusson, "Multilayer Waveguide–Grating Filters", *Appl. Opt.*, vol. 34, No. 14, pp. 2414–2420, 1995.

S.S. Wang and R. Magnusson, "Theory and Applications of Guided–Mode Resonance Filters", *Appl. Opt.*, vol. 32, No. 14, pp. 2606–2613, 1993.

Sah, et al., "Carrier Generation and Recombination in $P$–$N$ Junctions and $P$–$N$ Junction Characteristics," Proceedings of the IRE, pp. 1228–1243, Sep. 1957.

Schubert, "Resonant Cavity Light–Emitting Diode", *Appl. Phys. Lett.*, vol. 60, No. 8, pp. 921–923, Feb. 24, 1992.

Shi, et al., "Photoluminescence study of hydrogenated aluminum oxide–semiconductor interface," Applied Physics Letters, vol. 70, No. 10, pp. 1293–1295, Mar. 10, 1997.

Smith, R.E. et al., Polarization–Sensitive Subwavelength Antireflection Surfaces on a Semiconductor for 975 NM, *Optics Letters*, vol. 21, No. 15, Aug. 1, 1996, pp. 1201–1203.

Spicer, et al., "The Unified Model For Schottky Barrier Formation and MOS Interface States in 3–5 Compounds," Applications of Surface Science, vol. 9, pp. 83–01, 1981.

Suning Tang et al., "Design Limitations of Highly Parallel Free-Space Optical Interconnects Based on Arrays of Vertical Cavity Surface–Emitting Laser Diodes, Microlenses, and Photodetectors", Journal of Lightwave Technology, vol. 12, No. 11, Nov. 1, 1994, pp. 1971–1975.

T. Mukaihara, "Polarization Control of Vertical–cavity Surface–Emitting Lasers by a Birefringent Metal/Semiconductor Polarizer Terminating a Distributed Bragg Reflector," Tokyo Institute of Technology, Precision and Intelligence Laboratory, pp. 183–184.

Tai K., et al., "90% Coupling of Top Surface Emitting GAAS/ALGAAS Quantum Well Laser Output Into 8M Diameter Core Silica Fibre," Electronics Letters, IEE Stevenage, GB, vol. 26, No. 19, Sep. 13, 1990, pp. 1628–1629.

Tao, Andrea, "Wet–Oxidation of Digitally Alloyed AIGaAs," National Nanofabrication Users Network, Research Experience for Undergraduates 2000, 2 pages.

Tatum, et al., Commercialization of Honeywell's VCSEL Technology, Published in Proceedings fo the SPIE, vol. 3946, SPI, 2000, 12 pages.

Tshikazu Mukaihara, et al., "A Novel Birefringent Distributed Bragg Reflector Using a Metal/Dielectric Polarizer for Polarization Control of Surface–Emitting Lasers," Japan J. Appl. Phys. vol. 33 (1994) pp. L227–L229, Part 2, No. 2B, Feb. 15, 1994.

Tu, Li–Wei et al., "Transparent conductive metal–oxide contacts in vertical–injection top–emitting quantum well lasers", Appl. Phys. Lett. 58(8) Feb. 25, 1991, pp. 790–792.

Wieder, H.H., "Fermi level and surface barrier of $Ga_xIn_{1-z}As$ alloys," Applied Physics Letters, vol. 38, No. 3, pp. 170–171, Feb. 1, 1981.

Wipiejewski, et al., "VCSELs for datacom applications," Invited Paper, Part of the SPIE Conference on Vertical–Cavity Surface–Emitting Lasers III, San Jose, California, SPIE, vol. 3627, pp. 14–22, Jan. 1999.

Y. M. Yang et al., "Ultralow Threshold Current Vertical Cavity Surface Emitting Lasers Obtained with Selective Oxidation", *Elect. Lett.* , vol. 31, No. 11, pp. 886–888, May 25, 1995.

Yablonovitch et al., "Photonic Bandgap Structures", *J. Opt. Soc. Am. B.*, vol. 10, No. 2, pp. 283–295, Feb. 1993.

Young et al., "Enhanced Performance of Offset–Gain High Barrier Vertical–Cavity Surface–Emitting Lasers", *IEEE J. Quantum Electron.*, vol. 29, No. 6, pp. 2013–2022, Jun. 1993.

Zhou D., et al., "Simplified–Antiresonant Reflecting Optical Waveguide–Type Vertical–Cavity Surface–Emitting Lasers," Applied Physics Letters, American Institute of Physics, New York, vol. 76, No. 13, Mar. 27, 2000, pp. 1659–1661.

U.S. patent application Ser. No. 09/751,422, filed Dec. 29, 2000, entitled "Resonant Reflector for Use with Optoelectronic Devices".

U.S. patent application Ser. No. 09/751,423, filed Dec. 29, 2000, entitled "Spatially Modulated Reflector for an Optoelectronic Device".

* cited by examiner

SINGLE MODE VCSEL

BACKGROUND OF THE INVENTION

1. Field of the Invention

This invention relates to vertical cavity surface emitting lasers. More specifically, it relates to vertical cavity surface emitting lasers having heat spreading layers that assist single mode operation.

2. Discussion of the Related Art

Vertical cavity surface emitting lasers (VCSELs) represent a relatively new class of semiconductor lasers. In a VCSEL, optical emission occurs normal to the plane of a PN junction. VCSELs have certain advantages over edge-emitting laser diodes, including smaller optical beam divergence and better-defined and more circular laser beams. Such advantages make VCSELs well suited for optical data storage, data and telecommunication systems, and laser scanning.

VCSELs can be formed from a wide range of material systems to produce specific characteristics. VCSELs typically have active regions, distributed Bragg reflector (DBR) mirrors, current confinement structures, substrates, and contacts. Because of their complicated structure and because of their material requirements, VCSELs are usually grown using metal-organic chemical vapor deposition (MOCVD).

To assist the understanding of VCSELs, FIG. 1 illustrates a typical VCSEL 10. As shown, an n-doped gallium arsenide (GaAs) substrate 12 is disposed with an n-type electrical contact 14. An n-doped lower mirror stack 16 (a DBR) is on the GaAS substrate 12, and an n-type graded-index lower spacer 18 is disposed over the lower mirror stack 16. An active region 20 with quantum wells is formed over the lower spacer 18. A p-type graded-index top spacer 22 is disposed over the active region 20, and a p-type top mirror stack 24 (another DBR) is disposed over the top spacer 22. Over the top mirror stack 24 is a p-conduction layer 9, a p-type GaAs cap layer 8, and a p-type electrical contact 26.

Still referring to FIG. 1, the lower spacer 18 and the top spacer 22 separate the lower mirror stack 16 from the top mirror stack 24 such that an optical cavity is formed. As the optical cavity is resonant at specific wavelengths, the mirror separation is controlled to resonant at a predetermined wavelength (or at a multiple thereof). At least part of the top mirror stack 24 includes an insulating region 40 that is formed by implanting protons into the top mirror stack 24, or by forming an oxide layer. In either event, the insulating region 40 has a conductive annular central opening 42 that forms an electrically conductive path though the insulating region 40.

In operation, an external bias causes an electrical current 21 to flow from the p-type electrical contact 26 toward the n-type electrical contact 14. The insulating region 40 and its conductive central opening 42 confine the current 21 flow through the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type GaAs cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, providing a p-type substrate), different material systems can be used, operational details can be varied, and additional structures, such as tunnel junctions, can be added.

While generally successful, VCSELs are not without problems. One set of problems is particularly prevalent in high power data and telecommunication applications. Such applications often require a high power single mode laser light source that operates at a long wavelength, such as 1310 or 1550 nanometers, and that illuminates a single mode optical fiber. Because of their wide range of material systems, VCSELs can operate at such wavelengths. Furthermore, single mode VCSEL operation is also well known. However, efforts to produce suitable high power single mode, long wavelength VCSEL sources have been plagued by temperature performance problems, specifically the ability to meet minimum power requirements while maintaining single transverse mode operation.

Meeting commonly required power output is a particular problem because a VCSEL has an active region with a small volume. Increasing the optical output power increases the active region temperature, which tends to produce multiple transverse optical modes. Alternatively, producing a VCSEL with a highly stable single mode operation typically requires a high lasing threshold current, which tends to produce a low optical output and/or poor electrical response. Furthermore, some highly stable single mode VCSELs have refractive index differences between where current is injected into the active region and peripheral areas. This produces a thermal lens effect and poor optical confinement.

Another problem with incorporating VCSELs into high power data and telecommunication systems is aligning the system's optical fiber with light emitted from a VCSEL. Thermal problems can complicate alignment, particularly when external cooling devices or structures are used to reduce the operating temperature of the VCSEL.

Therefore, a new type of highly stable, single mode VCSEL would be beneficial. Even more beneficial would be a new type of highly stable, high power, single mode VCSEL that is suitable for use in long wavelength applications. Still more beneficial would be a technique of aligning the optical output of a VCSEL to an optical fiber.

SUMMARY OF THE INVENTION

Accordingly, the principles of the present invention are directed to a new type of highly stable, single mode VCSELs that substantially obviates one or more limitations and/or disadvantages of the related art. The principles of the present invention are suitable for producing a highly stable, high power single mode VCSEL that is suitable for use in long wavelength applications, beneficially in a manner that incorporates a passive alignment structure.

A VCSEL according to the principles of the present invention includes a heat spreading layer that is adjacent a semiconductor buffer layer containing an insulating region. That heat spreading layer is beneficially an opaque metallic contact layer that sources electrical current for an active region. The heat spreading layer beneficially includes an opening that enables light emitted by the active region to reflect from a distributed Bragg reflector (DBR) top mirror. If required, a tunnel junction can be disposed between the heat spreading layer and the active region.

Below the active region is a semiconductor substrate. In some applications, a semiconductor buffer layer is disposed between the semiconductor substrate and the active region. In any event, a lower opaque metallic contact layer that sinks electrical current is on the substrate. The lower opaque metallic contact layer is fabricated in a manner that permits light emitted from the active region to reflect from a distributed Bragg reflector (DBR) lower mirror.

The semiconductor substrate can include a slot that enables light from the distributed Bragg reflector (DBR) lower mirror to be aligned with an external feature. Beneficially, the slot is formed by anisotropic etching. Also beneficially, the slot acts as a passive alignment structure that enables optical alignment of light from the VCSEL with the external feature, such as an optical fiber or an optical coupling element.

Additionally, the top mirror structure can be etched to include a mirror tower. In that event, the upper metallic contact(s) can be formed on part of the top mirror or on a top buffer layer, while the mirror tower itself can be comprised of high electrical resistance mirror elements.

Additional features and advantages of the invention will be set forth in the description that follows, and in part will be apparent from that description, or may be learned by practice of the invention.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

Figure 1:
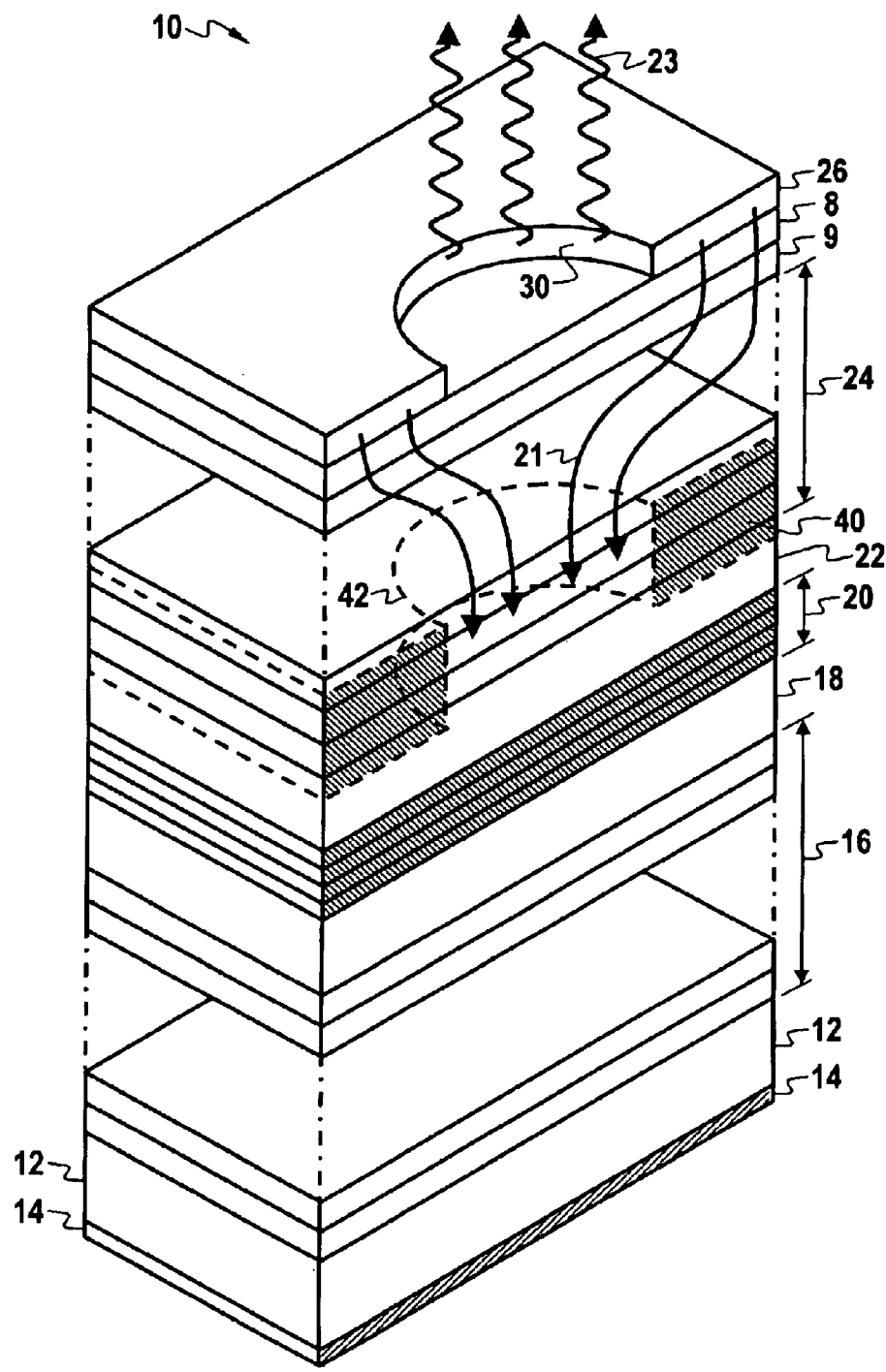
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

The principles of the present invention provide for VCSELs having heat spreading layers disposed adjacent an active region. Such VCSELs are particularly useful in single mode, long wavelength applications because the heat spreading layers reduce thermal lens effects and reduces thermal hot spots.

Figure 2:
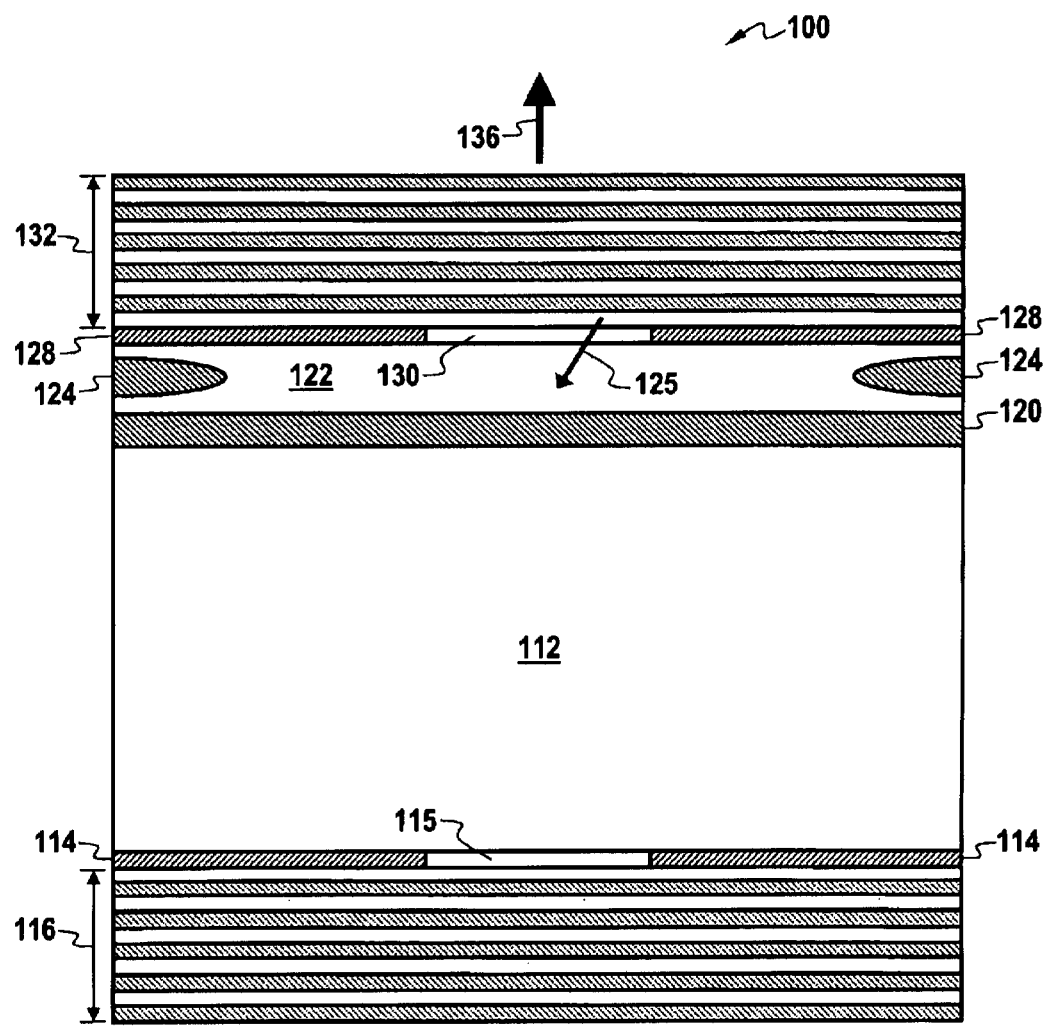
FIG. 2 illustrates a sectional view of a VCSEL according to the principles of the present invention.

A first example of a VCSEL according to the principles of the present invention is the VCSEL 100 illustrated in FIG. 2. As shown, the VCSEL 100 includes an n-doped substrate 112. That substrate is beneficially of GaAs, InP, or Si. The substrate is beneficially thinned to multiples of the wavelength of the laser light that is produced. Below the substrate 112 is a metallic n-side (bottom) electrical contact 114. The electrical contact provides for current flow through the substrate 112. Furthermore, the electrical contact 114 acts as a heat spreading layer that conducts heat away from the substrate 112. Below the electrical contact 114 is an n-doped lower mirror stack 116 (a DBR). The electrical contact 114 includes an opening 115 filled with a layer(s) of the lower mirror stack 116. If required, the lower mirror stack 116 can include a spacer (whose operation is described subsequently). The lower mirror stack 116 is comprised of alternating layers of low and high index materials, such as MgF, MgO, a-Si, WO, and TiO. As the electrical contact 114 is disposed between the substrate 112 and the lower mirror stack 116, the electrical resistance of the lower mirror stack becomes relatively unimportant. This provides a degree of design freedom that enables a wide selection of suitable lower mirror stack materials.

Over the substrate 112 is an active region 120 comprised of P-N junction structures having a number of quantum wells. Beneficially, the active region 120 is comprised of layers that lattice match with the substrate 112 and a number of quantum wells. Suitable active regions include InGaAlAs, InGaAsP, InGaAs, and InGaSb. Such active regions are suitable for obtaining emissions between 1.2 and 1.6 microns. Over the active region 120 is a p-doped semiconductor buffer layer 122. That buffer layer, which is beneficially lattice matched to the active region 120, includes an insulating layer 124. For example, the insulating layer 124 could be an oxide layer or a proton-implanted region. In any event the insulating layer 124 includes a conductive central opening 125.

Over part of the p-doped semiconductor buffer layer 122 is a metallic p-side (top) electrical contact 128. That electrical contact provides for current flow into the active region 120. Furthermore, the electrical contact 128 acts as a heat spreading layer that conducts heat away from the active region 120. Heat spreading is beneficial not only because it assists removing heat from the active region 120, but it also reduces thermal gradients in the active region 120 and in the semiconductor buffer layer 122. This reduces hot spots in the active region and reduces thermal lens effects, thereby improving single mode operation. The electrical contact 128 includes an opening 130.

Over the electrical contact 128 is a p-doped top mirror stack 132 (a DBR). The opening 130 is filled with a layer(s) of the top mirror stack 132. If required, the upper mirror stack 132 can include a spacer (whose operation is described subsequently). The top mirror stack 132 is comprised of alternating layers of low and high index materials, such as MgF, MgO, a-Si, WO, and TiO. As the electrical contact 128 is disposed between the substrate 112 and the top mirror stack 132, the electrical resistance of the top mirror stack is relatively unimportant. This provides a degree of design freedom that enables a wide selection of suitable top mirror stack materials. It should be understood that the p-doped top mirror stack 132 can include a dielectric section.

In operation, an external bias causes an electrical current to flow from the electrical contact 128 toward the electrical contact 114. The insulating region 122 and the conductive central opening 125 confine electrical current flow through the active region 120. Some of the electrons in the electrical current are converted into photons in the active region 120. Those photons bounce back and forth (resonate) between the lower mirror stack 116 and the top mirror stack 132, with the opening 130 enabling light to pass into the top mirror stack 132. While the lower mirror stack 116 and the top mirror stack 132 are very good reflectors, some of the photons leak out as light 136 that travels along an optical path.

For proper operation, the lower mirror stack 116 and the top mirror stack 132 must be separated by a distance that produces light at a determined wavelength. To that end, the substrate 112 and the semiconductor buffer layer 122, and possibly a spacer disposed between the substrate 112 and the lower mirror stack 116, are fabricated to separate the lower mirror stack 116 and the top mirror stack 132 the required distance. If used, the spacers are properly dimensioned to produce optical resonance at the desired wavelengths.

Figure 3:
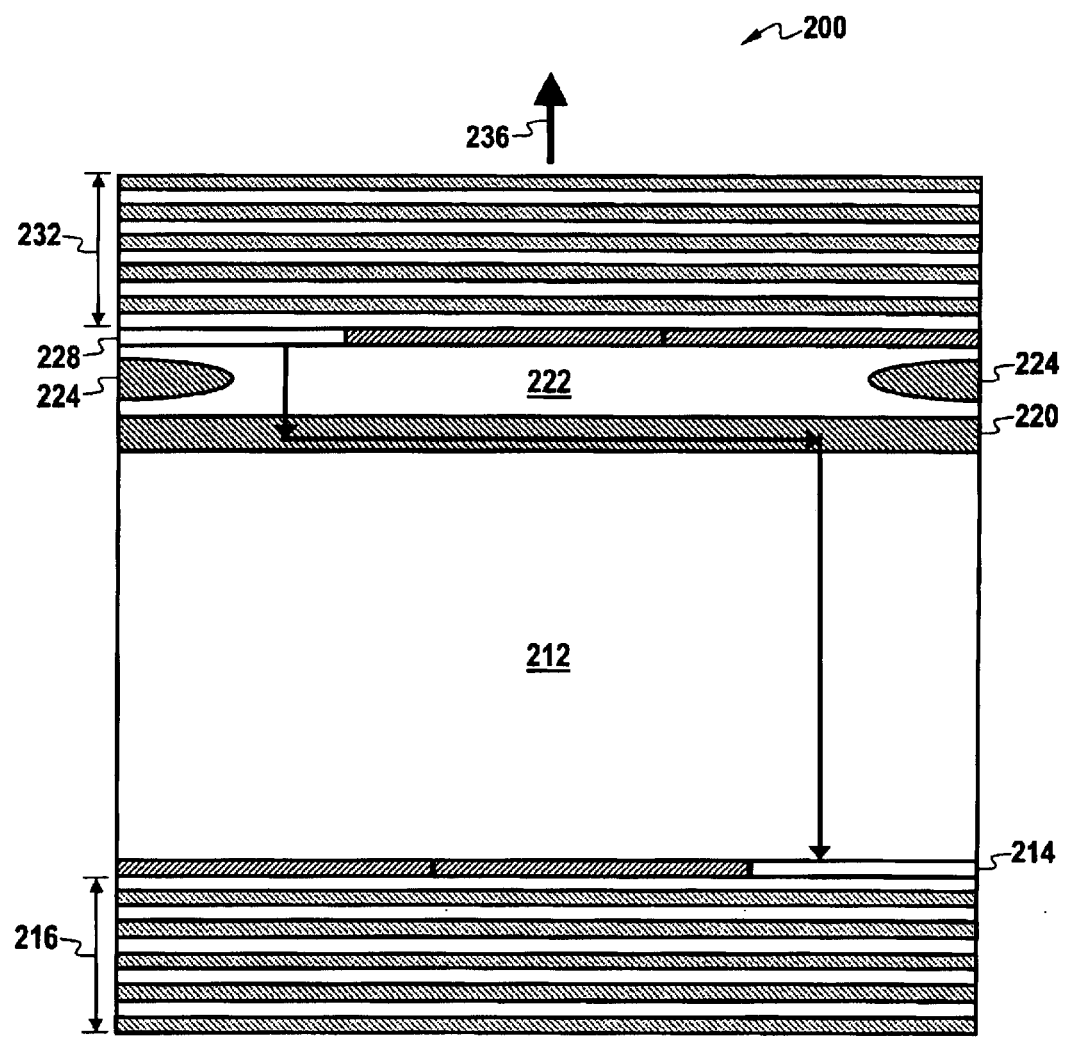
FIG. 3 illustrates a sectional view of an alternative VCSEL according to the principles of the present invention.

FIG. 3 illustrates an alternative VCSEL 200 that is in accord with the principles of the present invention. The VCSEL 200 includes an n-doped substrate 212, beneficially of GaAs, InP, or Si. On one side (in FIG. 3 on the right) below the substrate 212 is a metallic n-side (bottom) electrical contact 214. The electrical contact 214 enables current flow through the substrate 212. Furthermore, the electrical contact 214 acts as a heat spreading layer that conducts heat away from the substrate 212. Below the electrical contact 214, and below the part of the substrate 212 that is not covered by the electrical contact 214, is an n-doped lower mirror stack 216 (a DBR). If required, the lower mirror stack 216 can include a spacer. The lower mirror stack 216 is comprised of alternating layers of low and high index materials, such as MgF, MgO, a-Si, WO, and TiO.

Over the substrate 212 is an active region 220 comprised of P-N junction structures having a number of quantum wells. Beneficially, the active region 220 is comprised of materials that lattice match with the substrate 212. Suitable active region materials include InGaAlAs, InGaAsP, InGaAs, and InGaSb. Such active regions are suitable for obtaining emissions between 1.2 and 1.6 microns. Over the active region 220 is a p-doped semiconductor buffer layer 222. That buffer layer, which is beneficially lattice matched to the active region 220, includes an insulating structure 224. For example, the insulating structure 224 could be an oxide layer or a proton-implanted region.

Over part of the p-doped semiconductor buffer layer 222 is a metallic p-side (top) electrical contact 228. That electrical contact provides for current flow through the active region 220 to the electrical contact 214. As shown, the electrical contact 228 is disposed cater-corner to the electrical contact 214. Furthermore, the electrical contact 228 acts as a heat spreading layer that conducts heat away from the active region 220. Heat spreading is beneficial not only because it assists removing heat from the active region 220, but it also reduces thermal gradients in the active region 220 and in the semiconductor buffer layer 222. This reduces hot spots in the active region and reduces thermal lens effects in the buffer layer 222, thereby improving single mode operation.

Over the electrical contact 228, and over the part of the buffer layer that is not covered by the electrical contact 228, is a p-doped top mirror stack 232 (a DBR). The top mirror stack 232 is comprised of alternating layers of low and high index materials, such as MgF, MgO, a-Si, WO, and TiO. Additionally, the p-doped top mirror stack 132 may include a dielectric section.

Beneficially, the semiconductor buffer layer 222 acts as a spacer (whose operation was previously described). The operation of the VCSEL 200 is similar to the operation of the VCSEL 100. Light 236 is emitted by the VCSEL 200.

Figure 4:
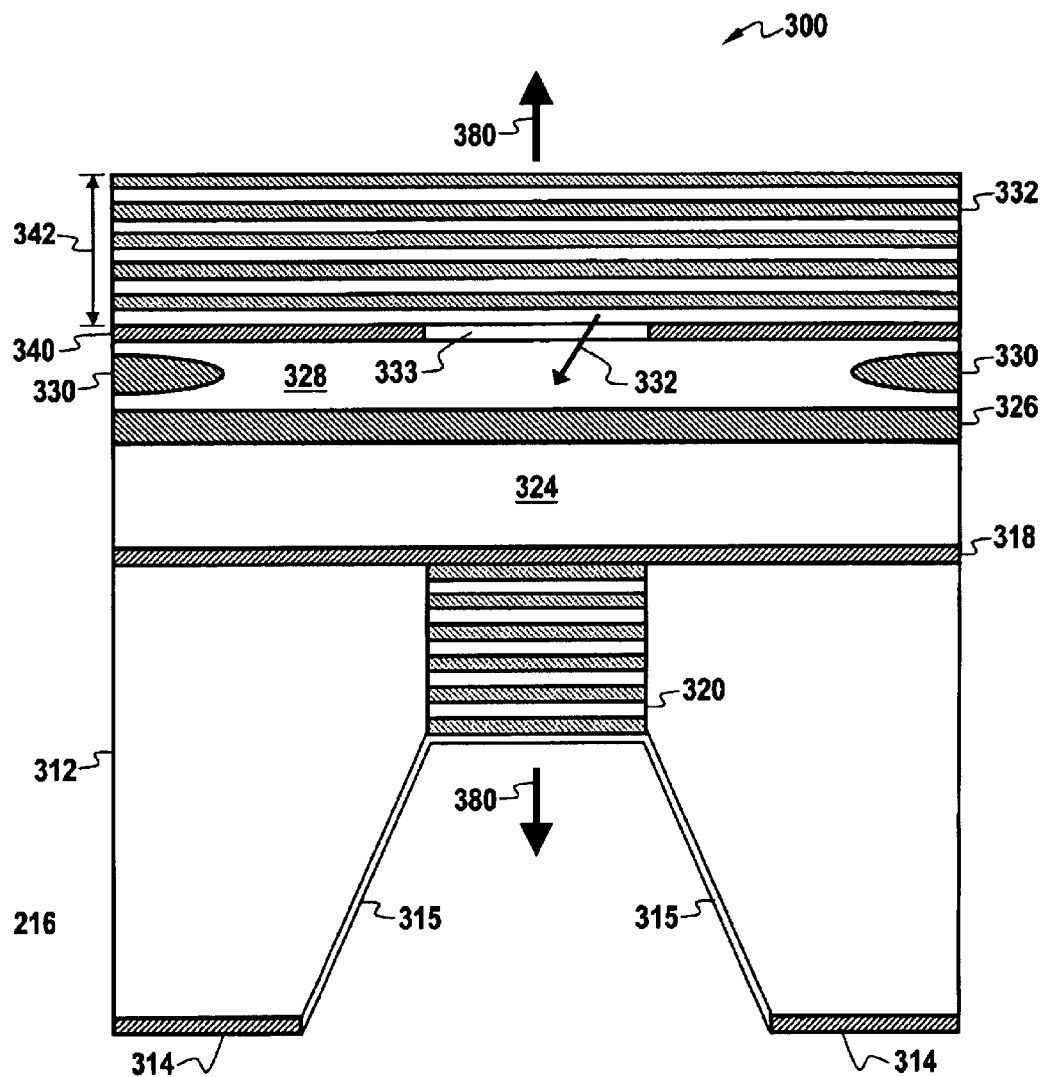
FIG. 4 illustrates a sectional view of another VCSEL according to the principles of the present invention.

Another embodiment VCSEL according to the principles of the present invention is the VCSEL 300 illustrated in FIG. 4. As shown, the VCSEL 300 includes an n-doped substrate 312. That substrate is beneficially of GaAs or InP. Below the substrate 312 is a ring-shaped metallic n-side (bottom) electrical contact 314. The electrical contact 314 surrounds inwardly tapered walls 315 that define an opening. The electrical contact 314 acts as a heat spreading layer that conducts heat away from the substrate 312, and that provides for electric current flow through that substrate. Above the substrate 312 is an etch stop layer 318. The etch stop layer is actually a layer that is part of a lower mirror stack 320 (a DBR) that extends into the substrate 312 from the etch stop layer 318 to the opening defined by the inwardly tapered walls 315. As current from the electrical contact 314 does not flow through the lower mirror stack 320 the lower mirror stack does not have to be highly conductive. This provides a degree of design freedom that enables a wide selection of suitable lower mirror stack materials. However, the lower mirror stack 320 is comprised of alternating layers of low and high index materials.

Still referring to FIG. 4, above the etch stop layer 318 is an n-type GaAs or InP buffer layer 324 that acts as a spacer. Above the buffer layer 324 is an active region 326 comprised of P—N junction structures having a number of quantum wells. Beneficially, the active region 326 is comprised of layers that lattice match with the buffer layer 324. Over the active region 326 is a p-doped semiconductor buffer layer 328. That buffer layer, which is beneficially lattice matched to the active region 326, includes an insulating structure 330. For example, the insulating structure 330 could be an oxide layer or a proton-implanted region. In any event the insulating structure 330 includes a conductive central opening 332.

Over the p-doped semiconductor buffer layer 328 is a ring-shaped metallic p-side (top) electrical contact 340. That electrical contact provides for current flow into the active region 326. Furthermore, the electrical contact 340 acts as a heat spreading layer that conducts heat away from the active region 326. Heat spreading is beneficial not only because it assists removing heat from the active region 326, but also because it reduces thermal gradients in the active region 326 and in the semiconductor buffer layer 328. This reduces hot spots in the active region and reduces thermal lens effects in the buffer layer, thereby improving single mode operation. The ring shaped electrical contact 340 has an opening 333 that is aligned with the opening 332.

Over the electrical contact 340 is a p-doped top mirror stack 342 (a DBR). The opening of the ring shaped electrical contact 340 is filled with a layer(s) of the top mirror stack 342. If required, the top mirror stack 342 can include a spacer (whose operation is described subsequently). The top mirror stack 342 is comprised of alternating layers of low and high index materials, such as MgF, MgO, a-Si, WO, and TiO. As the electrical contact 328 is disposed between the substrate 312 and the top mirror stack 342, the electrical resistance of the top mirror stack 342 is relatively unimportant. This provides a degree of design freedom that enables a wide selection of suitable top mirror stack materials.

The electrical operation of the VCSEL 300 is similar to that operation of the previously described VCSELs. However, as shown, light 380 is emitted from the top and bottom mirror structures.

Still referring to FIG. 4, the substrate 312 includes tapered walls 315. Such walls are beneficially formed by anisotropic etching of the subtrate 312. This is beneficially performed by forming the ring-shaped lower contact 314 such that the bottom surface of the substrate is exposed through the center of the ring. Then, etching the substrate 312 using the lower contact 314 as an etch mask.

Figure 5:
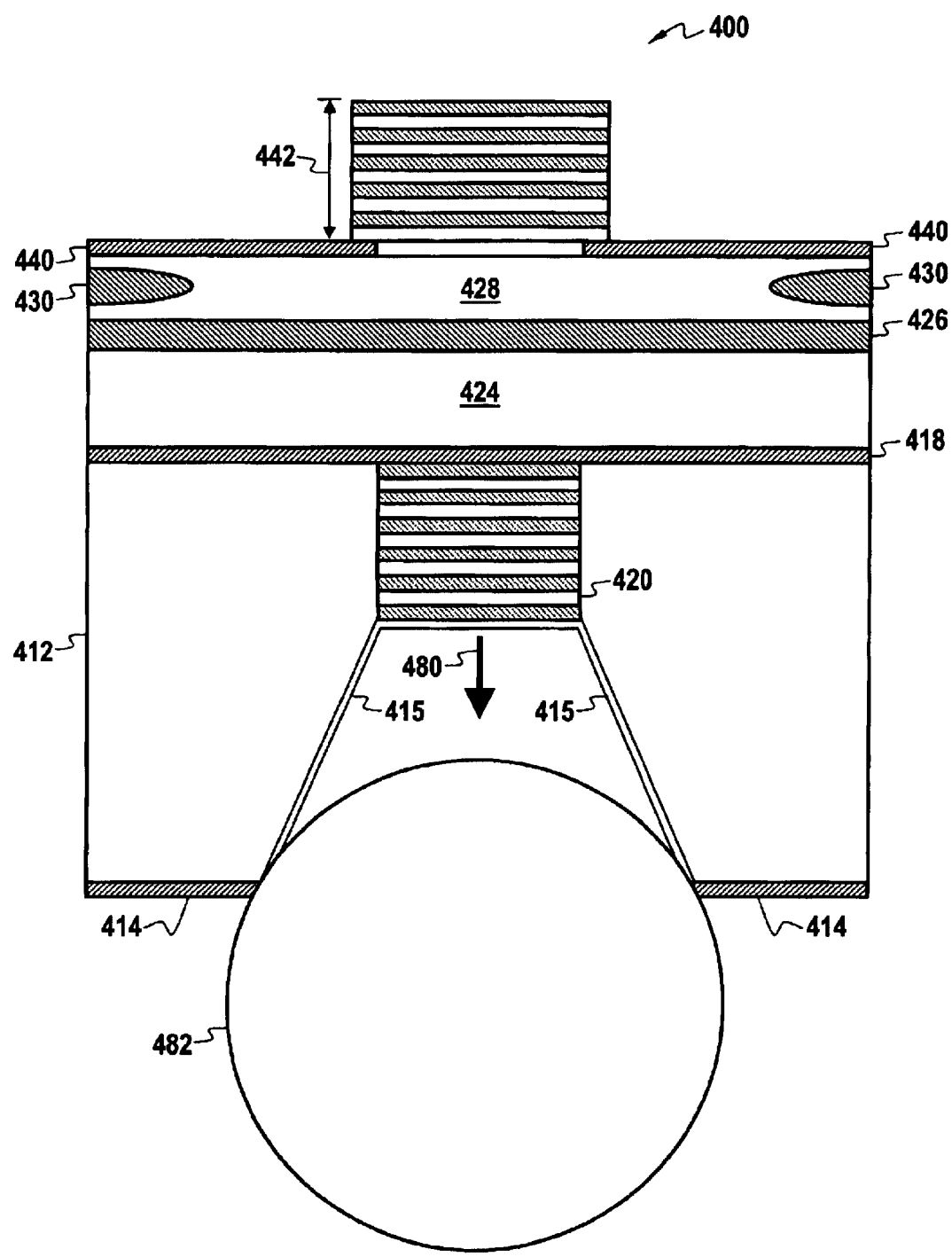
FIG. 5 illustrates a sectional view of still another VCSEL according to the principles of the present invention.

FIG. 5 illustrates yet another embodiment VCSEL 400 that is in accord with the principles of the present invention. As shown, the VCSEL 400 includes an n-doped substrate 412. That substrate is beneficially of GaAs or InP. Below the substrate 412 is a ring-shaped metallic n-side (bottom) electrical contact 414. The electrical contact 414 surrounds inwardly tapered walls 415 that define an opening. The electrical contact 414 acts as a heat spreading layer that conducts heat away from the substrate 412, and provides for electric current flow through that substrate.

Still referring to FIG. 5, above the substrate 412 is an etch stop layer 418. The etch stop layer is actually a layer that is part of a lower mirror stack 420 (a DBR) that extends into the substrate 412 from the etch stop layer 418 to the opening defined by the inwardly tapered walls 415. This provides a degree of design freedom that enables a wide selection of suitable lower mirror stack materials. The lower mirror stack 420 is comprised of alternating layers of low and high index materials.

Still referring to FIG. 5, above the etch stop layer 418 is an n-type GaAs or InP buffer layer 424 that acts as a spacer. Above the buffer layer 424 is an active region 426 comprised of P—N junction structures having a number of quantum wells. Beneficially, the active region 426 is lattice matched with the buffer layer 424. Over the active region 426 is a p-doped semiconductor buffer layer 428. That buffer layer, which is lattice matched to the active region 426, includes an insulating structure 430. For example, the insulating structure 430 could be an oxide layer or a proton-implanted region.

Over the p-doped semiconductor buffer layer 428 is a ring-shaped metallic p-side (top) electrical contact 440. That electrical contact provides for current flow into the active region 426. Furthermore, the electrical contact 440 acts as a heat spreading layer that conducts heat away from the active region 426. Heat spreading is beneficial not only because it assists removing heat from the active region 426, but also because it reduces thermal gradients in the active region 426 and in the semiconductor buffer layer 428. This reduces hot spots in the active region and reduces thermal lens effects in the buffer layer, thereby improving single mode operation.

Extending above the electrical contact 440 and through its ring is a p-doped top mirror stack 442 (a DBR). The top mirror stack 442, which can include a spacer, extends from the buffer layer 428 and is comprised of alternating layers of low and high index materials, such as MgF, MgO, a-Si, WO, and TiO. The electrical contact resistance of the top mirror stack 442 is relatively unimportant. If required, a metallic mirror can be located over the top mirror stack to block light leakage.

Still referring to FIG. 5, the opening formed by the tapered walls 415 defines an alignment structure that can be used to couple light 480 that leaves the VCSEL 400 into external elements. For example, FIG. 5 shows the light output from the VCSEL 400 being coupled into a glass bead 482 that is used to mate with an optical fiber (which is not shown). Thus, an etched feature can be used to align a VCSEL according to the principles of the present invention with external elements.

Figure 6:
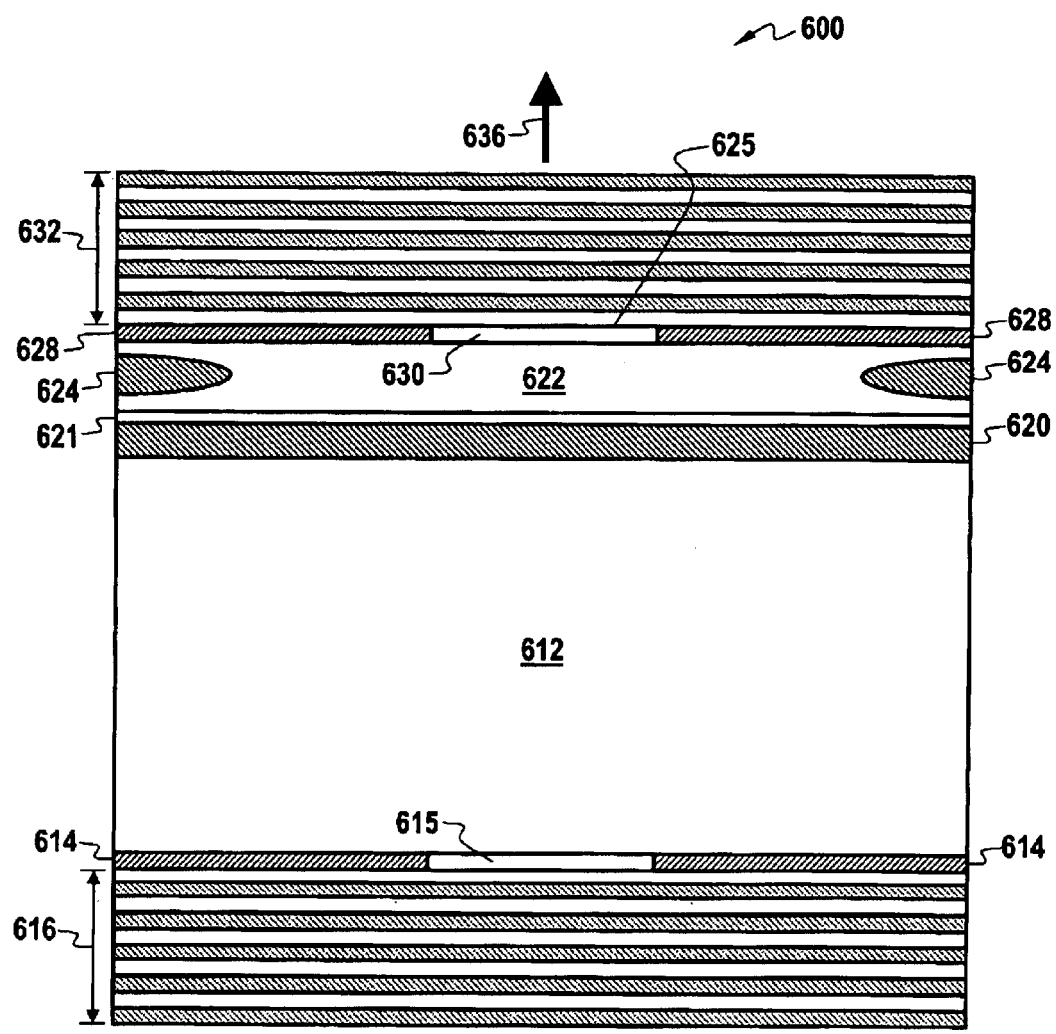
FIG. 6 illustrates a sectional view of yet another VCSEL according to the principles of the present invention.

Anther VCSEL according to the principles of the present invention is the VCSEL 600 illustrated in FIG. 6. As shown, the VCSEL 600 includes an n-doped substrate 612. That substrate is beneficially of GaAs, InP, or Si. Below the substrate 612 is a metallic n-side (bottom) electrical contact 614. The electrical contact provides for current flow through the substrate 612. Furthermore, the electrical contact 614 acts as a heat spreading layer that conducts heat away from the substrate 612. Below the electrical contact 614 is an n-doped lower mirror stack 616 (a DBR). The electrical contact 614 includes an opening 615 that is filled with a layer(s) of the lower mirror stack 616. If required, the lower mirror stack 616 can include a spacer (whose operation is described subsequently). The lower mirror stack 616 is comprised of alternating layers of low and high index materials, such as MgF, MgO, a-Si, WO, and TiO. As the electrical contact 614 is disposed between the substrate 612 and the lower mirror stack 616, the electrical resistance of the lower mirror stack becomes relatively unimportant. This provides a degree of design freedom that enables a wide selection of suitable lower mirror stack materials.

Over the substrate 612 is an active region 620 comprised of P-N junction structures having a number of quantum wells. Beneficially, the active region 620 is comprised of layers that lattice match with the substrate 612. Suitable active regions include InGaAlAs, InGaAsP, InGaAs, and InGaSb. Such active regions are suitable for obtaining emissions between 1.2 and 1.6 microns. Over the active region 620 is a tunnel junction 621 that converts holes into electrons that are then injected into the active region. The tunnel junction 621 enables n-type dopings of the layers above the tunnel junction. This reduces optical losses because p-doped layers tend to absorb more light than n-doped layers.

Over the tunnel junction 621 is an n-doped semiconductor buffer layer 622. That buffer layer includes an insulating layer 624. For example, the insulating layer 624 could be an oxide layer or a proton-implanted region. In any event the insulating layer 624 includes a conductive central opening 625.

Over part of the n-doped semiconductor buffer layer 622 is a metallic top electrical contact 628. That electrical contact provides for current flow into the active region 620. Furthermore, the electrical contact 628 acts as a heat spreading layer that conducts heat away from the active region 620/tunnel junction 621. The electrical contact 628 includes an opening 630. Over the electrical contact 628 is an n-doped top mirror stack 632 (a DBR). The opening 630 is filled with a layer(s) of the top mirror stack 632. If required, the upper mirror stack 632 can include a spacer. The top mirror stack 632 is comprised of alternating layers of low and high index materials, such as MgF, MgO, a-Si, WO, and TiO.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A vertical cavity surface emitting laser, comprising: a bottom distributed Bragg reflector;
   an active region over said bottom distributed Bragg reflector;
   a top distributed Bragg reflector over said active region; and
   a metallic contact between said active region and said top distributed Bragg reflector,
   wherein the top and bottom distributed Bragg reflectors define at least a minimum distance over which photons resonate within the vertical cavity surface emitting laser.

2. A vertical cavity surface emitting laser according to claim 1, wherein said active region has at least one quantum well.

3. A vertical cavity surface emitting laser according to claim 1, further including a substrate adjacent said active region.

4. A vertical cavity surface emitting laser according to claim 3, further including a bottom metallic contact over part of said substrate; and
   a bottom distributed Bragg reflector in optical contact with said substrate.

5. A vertical cavity surface emitting laser according to claim 4, wherein said bottom metallic contact is ring-shaped.

6. A vertical cavity surface emitting laser according to claim 4, wherein said bottom distributed Bragg reflector extends over said bottom metallic contact.

7. A vertical cavity surface emitting laser according to claim 4, wherein said substrate includes a cavity, and wherein said bottom distributed Bragg reflector has a surface within said cavity.

8. A vertical cavity surface emitting laser according to claim 7, wherein said bottom metallic contact surrounds said cavity.

9. A vertical cavity surface emitting laser according to claim 1, further including a lower buffer layer in contact with said active region.

10. A vertical cavity surface emitting laser according to claim 9, further including a substrate in contact with said lower buffer layer.

11. A vertical cavity surface emitting laser according to claim 10, further including:
    a bottom metallic contact over part of said substrate; and
    a bottom distributed Bragg reflector in optical contact with said substrate.

12. A vertical cavity surface emitting laser according to claim 11, wherein said bottom metallic contact is ring-shaped.

13. A vertical cavity surface emitting laser according to claim 11, wherein said substrate includes a cavity, and wherein said bottom distributed Bragg reflector has a surface within said cavity.

14. A vertical cavity surface emitting laser according to claim 13, wherein said bottom metallic contact surrounds said cavity.

15. A vertical cavity surface emitting laser according to claim 13, wherein said cavity is defined by inwardly sloping walls.

16. A vertical cavity surface emitting laser according to claim 13, wherein said cavity is aligned with emitted light.

17. A vertical cavity surface emitting laser according to claim 16, further including an external structure that extends into said cavity.

18. A vertical cavity surface emitting laser according to claim 1, further comprising a doped semiconductive top buffer layer adjacent said active region.

19. A vertical cavity surface emitting laser according to claim 18, further comprising an insulating structure within the top buffer layer.

20. A vertical cavity surface emitting laser according to claim 19, wherein said insulating structure includes an oxide region.

21. A vertical cavity surface emitting laser according to claim 19, wherein said insulating structure is an ion implanted region.

22. A vertical cavity surface emitting laser according to claim 18, further including a tunnel junction between said active region and said top buffer layer.

23. A method of forming a vertical cavity surface emitting laser, comprising:
    forming a bottom distributed Bragg reflector on a substrate;
    producing an active region on a substrate;
    forming a metallic contact over part of the active region; and
    forming a top distributed Bragg reflector over the active region, wherein the metallic contact is between the active region and the top distributed Bragg reflector, and wherein the top and bottom distributed Bragg reflectors define at least a minimum distance over which photons resonate within the vertical cavity surface emitting laser.

24. A vertical cavity surface emitting laser, comprising:
    a first distributed Bragg reflector;
    a second distributed Bragg reflector;
    an active region located between said first and said second Bragg reflector; and
    a top metallic contact between a portion of said active region and said second distributed Bragg reflector, wherein said first and second distributed Bragg reflectors define at least a minimum distance over which photons resonate within the vertical cavity surface emitting laser.

* * * * *

UNITED STATES PATENT AND TRADEMARK OFFICE
CERTIFICATE OF CORRECTION

PATENT NO. : 6,965,626 B2
APPLICATION NO. : 10/232382
DATED : November 15, 2005
INVENTOR(S) : Tatum et al.

It is certified that error appears in the above-identified patent and that said Letters Patent is hereby corrected as shown below:

Cover Page
Item (75), Inventors, change "James K Guenter" to --James K. Guenter--
Item (56), Page 2, References Cited, U.S. PATENT DOCUMENTS, "5,727,014" change "3/1997" to --3/1998--
Item (56), Page 3, References Cited, OTHER PUBLICATIONS, "Choe, et al., "Lateral..." change "AIAs" to --AlAs--
Item (56), Page 3, References Cited, OTHER PUBLICATIONS, "G. G. Ortiz, et al..." change "In0.2GA0.8As" to --In0.2Ga0.8As--
Item (56), Page 4, References Cited, OTHER PUBLICATIONS, "Kash, et al..." change "AIAs" to --AlAs--
Item (56), Page 4, References Cited, OTHER PUBLICATIONS, "Koley B., et al..." change "AIAs" to --AlAs--
Item (56), Page 4, References Cited, OTHER PUBLICATIONS, "Osinski,et al..." change "AIAs" to --AlAs--
Item (56), Page 4, References Cited, OTHER PUBLICATIONS, "Ries, et al..." change "AIAs – AIGaAs/InGaP" to --AlAs–AlGaAs/InAlP–InGaP--
Item (56), Page 5, References Cited, OTHER PUBLICATIONS, "Tao, Andrea,..." change "AIGaAs" to --AlGaAs--
Item (56), Page 5, References Cited, OTHER PUBLICATIONS, "Tatum, et al..." change "fo" to --for--

Column 1
Line 45, change "resonant" to --resonate--

Column 3
Line 61, change "reduces" to --reduce--

UNITED STATES PATENT AND TRADEMARK OFFICE
CERTIFICATE OF CORRECTION

PATENT NO. : 6,965,626 B2
APPLICATION NO. : 10/232382
DATED : November 15, 2005
INVENTOR(S) : Tatum et al.

It is certified that error appears in the above-identified patent and that said Letters Patent is hereby corrected as shown below:

Column 6
Line 52, change "328" to --340--
Line 58, before "operation" change "that" to --the--

Signed and Sealed this

Eighteenth Day of December, 2007

JON W. DUDAS
*Director of the United States Patent and Trademark Office*